United States Patent
Kim et al.

(10) Patent No.: US 9,768,358 B2
(45) Date of Patent: *Sep. 19, 2017

(54) VERTICAL TYPE LIGHT EMITTING DEVICE HAVING TRANSPARENT ELECTRODE AND METHOD OF MANUFACTURING THE SAME

(71) Applicant: KOREA UNIVERSITY RESEARCH AND BUSINESS FOUNDATION, Seoul (KR)

(72) Inventors: Tae Geun Kim, Seongnam-si (KR); Hee-Dong Kim, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/370,076

(22) Filed: Dec. 6, 2016

(65) Prior Publication Data

US 2017/0084792 A1 Mar. 23, 2017

Related U.S. Application Data

(62) Division of application No. 14/768,870, filed as application No. PCT/KR2013/006804 on Jul. 30, 2013, now Pat. No. 9,559,262.

(30) Foreign Application Priority Data

Feb. 20, 2013 (KR) .......................... 10-2013-0017915

(51) Int. Cl.
*H01L 29/24* (2006.01)
*H01L 33/42* (2010.01)
(Continued)

(52) U.S. Cl.
CPC .......... *H01L 33/42* (2013.01); *H01L 33/0025* (2013.01); *H01L 33/0075* (2013.01);
(Continued)

(58) Field of Classification Search
CPC ......... H01L 33/36; H01L 33/40; H01L 33/42; H01L 31/1884; H01L 2933/0016
(Continued)

(56) References Cited

U.S. PATENT DOCUMENTS 7,358,541 B2 * 4/2008 Seong .................... H01L 33/405
257/98
2010/0230714 A1 * 9/2010 Shinohara ............... H01L 33/14
257/103
(Continued)

OTHER PUBLICATIONS

Co-Pending U.S. Appl. No. 15/379,744, filed Dec. 15, 2016, Kim et al., claims 1-9.*

Primary Examiner — Matthew E Warren
(74) Attorney, Agent, or Firm — Kile Park Reed & Houtteman PLLC

(57) ABSTRACT

Provided is a vertical type light emitting device and a method of manufacturing the same. A transparent electrode having high transmittance with respect to light in the entire range and constructed by using a resistance change material of which resistance state is to be changed from a high resistance state to a low resistance state if a voltage exceeding a threshold voltage inherent in a material is applied so that conducting filaments are formed is formed between an electrode pad and a semiconductor layer of a light emitting device. The transparent electrode has high transmittance with respect to the light in a UV wavelength range as well as in a visible wavelength range generated in the light emitting device. Since the conductivity of the transparent electrode is heightened due to the formation of the conduct-
(Continued)

ing filaments, the transparent electrode has good ohmic contact characteristic with respect to a semiconductor layer.

9 Claims, 10 Drawing Sheets

(51) Int. Cl.
    *H01L 33/14* (2010.01)
    *H01L 33/00* (2010.01)
    *H01L 33/06* (2010.01)
    *H01L 33/32* (2010.01)
    *H01L 33/38* (2010.01)
    *H01L 33/46* (2010.01)
    *H01L 33/40* (2010.01)

(52) U.S. Cl.
    CPC ...... *H01L 33/0079* (2013.01); *H01L 33/0095* (2013.01); *H01L 33/06* (2013.01); *H01L 33/14* (2013.01); *H01L 33/32* (2013.01); *H01L 33/38* (2013.01); *H01L 33/46* (2013.01); *H01L 33/405* (2013.01); *H01L 2933/0016* (2013.01); *H01L 2933/0025* (2013.01)

(58) Field of Classification Search
    USPC ........................................ 257/13, 98, 99, 103
    See application file for complete search history.

(56) References Cited

U.S. PATENT DOCUMENTS

| | | | |
|---|---|---|---|
| 2011/0169027 A1* | 7/2011 | Park | H01L 33/42 257/98 |
| 2012/0292634 A1* | 11/2012 | Bae | H01L 33/42 257/76 |
| 2014/0054636 A1* | 2/2014 | Anzue | H01L 33/32 257/98 |

* cited by examiner

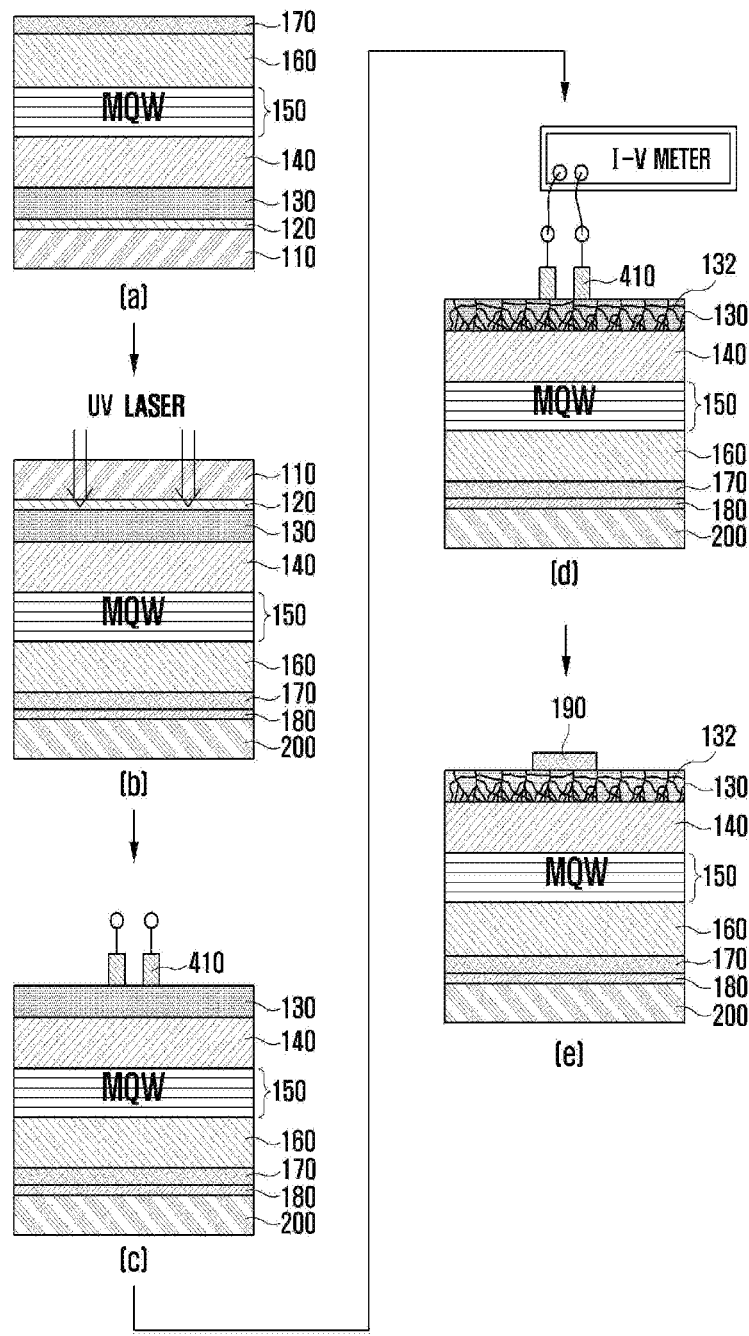

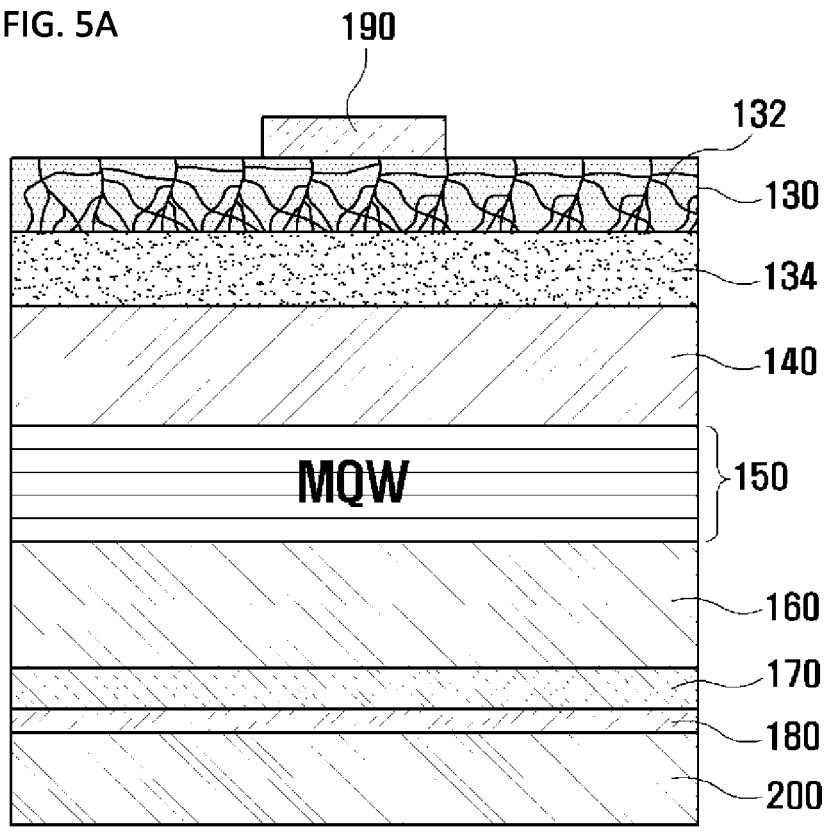

VERTICAL TYPE LIGHT EMITTING DEVICE HAVING TRANSPARENT ELECTRODE AND METHOD OF MANUFACTURING THE SAME

CROSS REFERENCE TO RELATED APPLICATIONS

This application is a divisional application of U.S. patent application Ser. No. 14/768,870, filed on Aug. 19, 2015 (currently pending), the disclosure of which is herein incorporated by reference in its entirety. The U.S. patent application Ser. No. 14/768,870 is a national entry of International Application No. PCT/KR2013/006804, filed on Jul. 30, 2013, which claims priority to Korean Application No. 10-2013-0017915 filed on Feb. 20, 2013, the entire contents of which are incorporated herein by reference.

BACKGROUND OF THE INVENTION

1. Field of the Invention

The present invention relates to a light emitting device and a method of manufacturing the light emitting device, and more particularly to, a light emitting device including a transparent electrode and a method of manufacturing the light emitting device.

2. Description of the Related Art

Recently, in order to improve performance of a whitelight LED used for various applications such as a backlight source of an LCD display, solid-state lighting (SSL), and flashlight, high efficiency/high power GaN based LEDs have been actively researched.

However, in a lateral-conducting GaN-based LED having a simple structure which is widely used in the related art, since anode and cathode are designed to be formed in the same direction, a current concentration effect (current-crowding effect; CCE) occurs in the n-type electrode, and particularly, a thermal problem occurs due to insulating properties of sapphire used for a substrate. Therefore, the lateral-conducting GaN-based has a limitation in improving output power of the LED by injecting high current.

In order to solve the above-mentioned problems of the lateral-conducting GaN-based LED, a vertical-conducting structure LED (VLED) where electrodes are designed to be formed above and below the LED has been researched. In addition, a vertical-conducting structure metal-substrate GaN LED (VM-LED) where a sapphire substrate is lifted off by using laser (laser lift-off; LLO) and a metal is used as a substrate for efficiently releasing heat has been researched.

In comparison to the lateral-conducting structure GaN-based LED, the performance of the VM-LED is greatly improved. Namely, the output power $P_O$ of the VM-LED is increased, and the operating voltage (forward voltage; $V_F$) thereof is decreased. However, in the manufacturing of the high-power LED, there are still the problems of current concentration (current crowding) in the portion below the n-type metal contact pad into current is injected, non-uniform current dispersion, and non-uniform light emission.

In order to solve the problems, in many research groups, an N-face n-GaN layer where a convex-concave pattern is formed and metal are formed to be in good ohmic contact to implement uniform current injection and uniform current dispersion in the n-type electrode of the VLED. In addition, in many research groups, the n-type electrode is efficiently designed to implement uniform current dispersion and uniform current injection.

In order to implement uniform current dispersion and injection, the contact area of the n-electrode is allowed to be increased (n-electrode pattern design), or a current blocking layer (CBL) is used. In addition, a transparent conduction layer (TCL) and a transparent conduction electrode (TCE) may also be inserted between the n-electrode and the GaN layer. However, the above-mentioned techniques in the related art have the problems, as follows.

First, if the contact area of the n-type electrode is increased, uniform current dispersion and injection can be advantageously implemented. However, since light emitted from an activation layer (multi quantum well; MQW) is blocked or absorbed, light extraction efficiency is deteriorated.

In the case where a current blocking layer is inserted, since the current blocking layer is formed by inserting an insulating material having almost the same size as the n-type electrode into a symmetric position of the p-GaN layer, current concentrated below the n-type electrode can be advantageously dispersed. However, since current does not flow through the current blocking layer, the current can be injected into the portion excluding the current blocking layer. Namely, since the current is not injected through the entire area of the p-GaN layer, there is a problem in terms of efficiency. In addition, since the current blocking layer needs to be formed at an accurate position with an accurate size, there is difficulty in the manufacturing process.

Finally, in the technique of inserting a transparent conduction layer, there is an advantage in that current can be effectively dispersed and injected by using an n-type electrode having a small area. However, when the light is emitted out, since the light is absorbed by the transparent conduction layer, for example, ITO (indium tin oxide), IZO (indium zinc oxide), there is a problem in that the light extraction efficiency is decreased.

In the case of the UV-LED for which demands have been greatly increased recently, the problem of decrease in light extraction efficiency becomes more serious.

FIG. 1 is a graph illustrating transmittance in the case where an ITO transparent electrode is formed on a p-GaN semiconductor layer in the related art. As illustrated in FIG. 1, the transmittance of the ITO transparent electrode is 80% or more in a wavelength range of 350 nm or more, but the transmittance is greatly decreased in a short wavelength range, that is, a UV wavelength range. Particularly, in a short wavelength range of 280 nm or less, the transmittance is decreased down to 20% or less. In order to solve the problem, in another technique in the related art, the transparent electrode is not formed on the semiconductor layer such as a p-AlGaN layer, but a metal electrode pad is directly formed thereon. However, since a different in work function between the metal and the semiconductor layer is too large, ohmic contact is not formed therebetween, and current is concentrated on the metal electrode pad so as not to spread over the entire activation layer. In other words, the above-described problems still occur.

Although various researches have been made in order to solve the above-described problems, a transparent electrode capable of solving the problem of current concentration and implementing high transmittance and high conductivity with respect to light in a UV wavelength range has not been developed. This is because conductivity and transmittance of a material has a trade-off relationship. Since a material having as high transmittance as it can be used in a UV wavelength range has a large band gap (larger than the band gap (3.4 eV) of ITO), the material has too low conductivity to be used as an electrode and is not in ohmic contact with a semiconductor material. Therefore, it is impossible to use the material as an electrode.

SUMMARY OF THE INVENTION

The present invention is to provide a vertical type light emitting device including a transparent electrode having high transmittance and good ohmic contact characteristic with respect to a semiconductor layer and capable of solving a problem of current concentration with respect to light in the entire wavelength range including visible light and UV light and a method manufacturing the vertical type light emitting device.

According to an aspect of the present invention, there is provided a vertical type light emitting device including: a substrate; a reflective layer which is formed on the substrate; a second semiconductor layer which is formed on the reflective layer; an activation layer which is formed on second semiconductor layer to generate light; a first semiconductor layer which is formed on the activation layer; and a transparent electrode which is formed on first semiconductor layer by using a transparent insulating material of which resistance state is to be changed from a high resistance state into a low resistance state according to an applied electric field.

In the above aspect, a forming process may be performed on the transparent electrode by applying a threshold voltage or more inherent in a material of the transparent electrode, so that conducting filaments are formed in the transparent electrode.

In addition, in the above aspect, a convex-concave pattern may be formed on a surface of the transparent electrode.

In addition, in the above aspect, the transparent electrode may be configured to include a plurality of transparent electrode layers of which refractive indexes are gradually decreased.

In addition, in the above aspect, the transparent electrode may be formed with any one of a transparent oxide based material, a transparent nitride based material, a transparent polymer based material, and a transparent nano material.

In addition, in the above aspect, the vertical type light emitting device may further include a current spreading layer which is formed by using CNT (carbon nano tube) or graphene between the first semiconductor layer and the transparent electrode.

In addition, in the above aspect, the vertical type light emitting device may further include a current spreading layer which is formed by using CNT or graphene and is in contact with a surface of transparent electrode opposite to a surface of the transparent electrode which is in contact with the first semiconductor layer.

In addition, in the above aspect, the first semiconductor layer may be formed with an n-AlGaN layer or an n-GaN layer, and the second semiconductor layer may be formed with a p-AlGaN layer or a p-GaN layer.

According to another aspect of the present invention, there is provided a method of manufacturing a vertical type light emitting device, including: (a) forming a transparent electrode on a substrate by using a transparent insulating material of which resistance state is to be changed from a high resistance state into a low resistance state according to an applied electric field; (b) sequentially forming a first semiconductor layer, an activation layer which generates light, a second semiconductor layer, and a reflective layer on the transparent electrode; (c) bonding a submount substrate so as to be in contact with the reflective layer and separating the substrate; and (d) changing the resistance state of the transparent electrode into a low resistance state by applying a voltage to the transparent electrode.

In the above aspect, the (d) changing of the resistance state may be performing a forming process by applying a threshold voltage or more to the transparent electrode, so that conducting filaments are formed in the transparent electrode.

In addition, in the above aspect, the (c) bonding of the submount substrate may further include: (c1) forming a bonding layer on the reflective layer and bonding a submount substrate to the bonding layer; and (c2) separating the substrate from the transparent electrode.

In addition, in the above aspect, the (d) changing of the resistance state may be forming a convex-concave pattern on a surface of the transparent electrode and changing a resistance state of the transparent electrode into a low resistance state.

In addition, in the above aspect, in the (a) forming of the transparent electrode, the transparent electrode may be configured by sequentially forming a plurality of transparent electrode layers of which refractive indexes are gradually increased.

In addition, in the above aspect, the transparent electrode may be formed by using any one of a transparent oxide based material, a transparent nitride based material, a transparent polymer based material, and a transparent nano material.

In addition, in the above aspect, the method may further include, between the (a) forming of the transparent electrode and the (b) sequentially forming of the first semiconductor layer, the activation layer which generates light, the second semiconductor layer, and the reflective layer, forming a current spreading layer on the transparent electrode by using CNT or graphene, wherein, in the (b) sequentially forming of the first semiconductor layer, the activation layer which generates light, the second semiconductor layer, and the reflective layer, the first semiconductor layer is formed on the current spreading layer.

In addition, in the above aspect, the method may further include forming a current spreading layer on the transparent electrode of which resistance state is changed into a low resistance state by using CNT or graphene.

In addition, in the above aspect, the first semiconductor layer may be formed with an n-AlGaN layer or an n-GaN layer, and the second semiconductor layer may be formed with a p-AlGaN layer or a p-GaN layer.

In the present invention, a transparent electrode having high transmittance with respect to light in the entire range and constructed by using a resistance change material of which resistance state is to be changed from a high resistance state to a low resistance state if a voltage exceeding a threshold voltage inherent in a material is applied so that conducting filaments are formed is formed between a electrode pad and a semiconductor layer of a light emitting device.

Therefore, according to the present invention, current injected into an electrode pad is allowed to spread from the transparent electrode over the entire area of the light emitting device, so that the problem of current concentration is solved. The transparent electrode has high transmittance with respect to the light in a UV wavelength range (particularly, the light in a UV wavelength range of 340 nm to 280 nm and the light in a UV wavelength range of 280 nm or less) as well as the light in a visible wavelength range generated in the light emitting device. Since the conductivity of the transparent electrode is heightened due to the formation of the conducting filaments, the transparent electrode has good ohmic contact characteristic with respect to a semiconductor layer.

In addition, in the present invention, in the case where a current spreading layer formed by using CNT or graphene having good conductivity and transmittance characteristics is further formed on the upper or lower portion of the transparent electrode, conducting filaments formed in the transparent electrode are allowed to be connected to each other, so that the current flowing into the transparent electrode is allowed to spread over the semiconductor layer. Therefore, the current concentration phenomenon can be effectively prevented.

In addition, in the present invention, the transparent electrode of which refractive index (1.5 to 2.4) is smaller than that of a semiconductor layer is formed between air (refractive index=1) and the semiconductor layer (n-type GaN; refractive index=2.46), so that total reflection can be reduced due to a large difference in refractive index at the interface. Therefore, the light extraction efficiency can be further improved.

In addition, in the present invention, instead of ITO or IZO transparent electrodes in the related art which requires thermal treatment for improving optical characteristics, the transparent electrode in which the conducting filaments are to be formed to implement excellent optical characteristics without thermal treatment is used. Therefore, it is possible to improve electric characteristics and optical characteristics of the light emitting device in comparison to the light emitting device in the related art.

In addition, in the present invention, a convex-concave pattern is formed on a surface of the transparent electrode, or the transparent electrode is formed in a multi-layered structure, so that the refractive index can be adjusted. Therefore, it is possible to further improve optical characteristics.

BRIEF DESCRIPTION OF THE DRAWINGS

The above and other features and advantages of the present invention will become more apparent by describing in detail exemplary embodiments thereof with reference to the attached drawings in which:

FIG. 4 is a diagram illustrating processes of manufacturing a vertical type light emitting device where the transparent electrode is formed according to the first embodiment of the present invention;

FIGS. 5A and 5B are diagrams illustrating a configuration of a vertical type light emitting device according to a second embodiment of the present invention;

DETAILED DESCRIPTION OF THE INVENTION

Hereinafter, exemplary embodiments of the present invention will be described with reference to the attached drawings.

Figure 1:
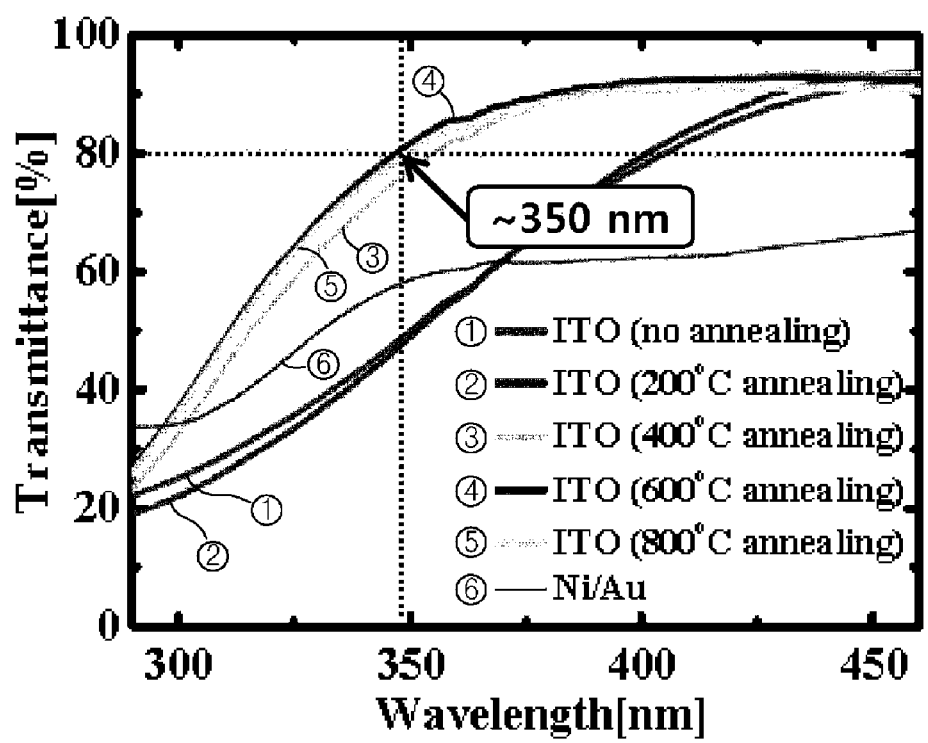
FIG. 1 is a graph illustrating transmittance in the case where an ITO transparent electrode is formed on a p-GaN semiconductor layer in the related art.
Figure 2:
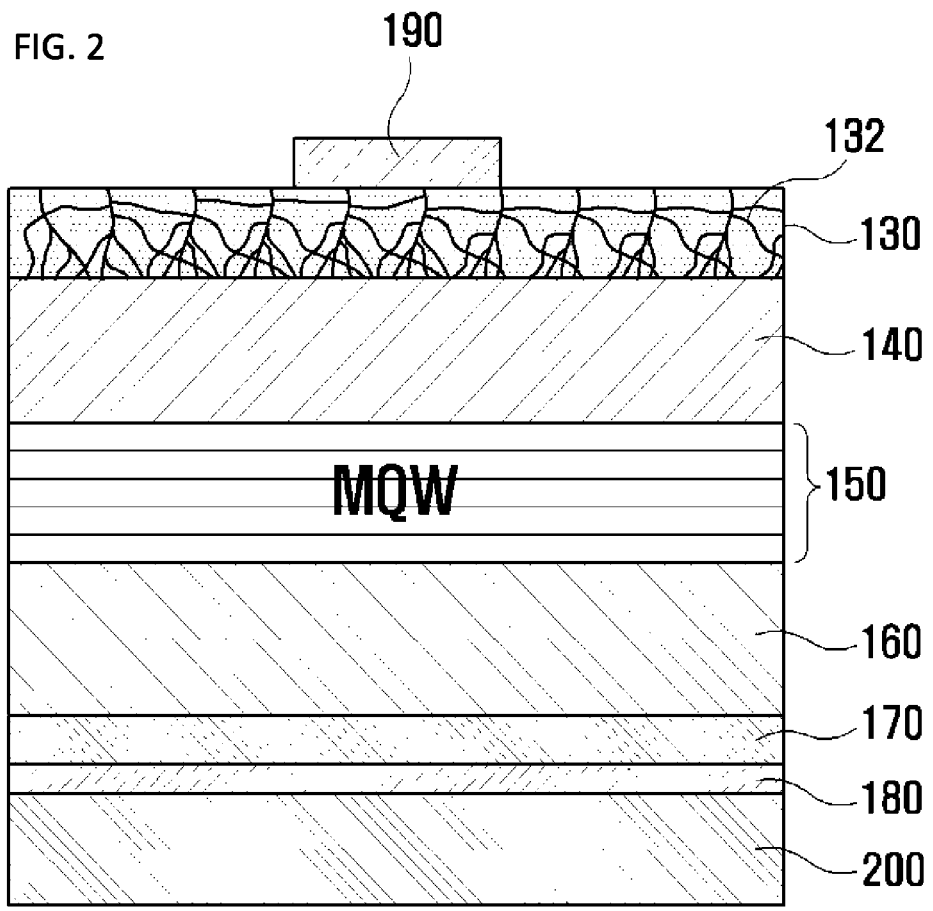
FIG. 2 is a diagram illustrating a configuration of a vertical type light emitting device including a transparent electrode according to a first embodiment of the present invention.

FIG. 2 is a diagram illustrating a configuration of a vertical type light emitting device including a transparent electrode according to a first embodiment of the present invention.

Referring to FIG. 2, the vertical type light emitting device according to the first embodiment of the present invention is configured by sequentially forming a reflective layer 170, a second semiconductor layer 160, an activation layer 150, a first semiconductor layer 140, and a transparent electrode 130 on a substrate 200 and by forming an n-type electrode pad 190 on the transparent electrode 130.

The substrate 200 may be configured by using a substrate which is generally used for manufacturing a vertical type light emitting device. P-type ohmic metal may be formed on each of two surfaces of the substrate 200. In addition, a reflective layer 170 is formed on the substrate 200. The reflective layer 170 may be formed by using Ag, Al, Pt, Au, Ni, Ti, ITO, or a combination thereof. Namely, there is no limitation to the material of the reflective layer.

The second semiconductor layer 160 is a semiconductor layer doped as a p type. In the embodiment of the present invention, the second semiconductor layer 160 is formed with a single layer of p-GaN. In addition, the second semiconductor layer 160 is formed with a single layer of p-AlGaN so as to generate light in a UV wavelength range, or the second semiconductor layer 160 is formed by sequentially forming a p-GaN layer and a p-AlGaN layer. However, the second semiconductor layer may also be formed with a general material used for manufacturing a light emitting device.

In the embodiment of the present invention, it is preferable that the activation layer 150 (MQW) is formed with Al(In)GaN/(In)GaN so as to generate light in a UV wavelength range. However, any material capable of generating light in a UV wavelength range can be used for the activation layer 150 of the light emitting device without limitation.

The first semiconductor layer 140 is a semiconductor layer doped as an n type. In the embodiment of the present invention, the first semiconductor layer 140 is formed with n-GaN, or the first semiconductor layer 140 is formed with n-AlGaN so as to generate light in a UV wavelength range. However, the first semiconductor layer may also be formed with a general material used for manufacturing a light emitting device.

In the above-described embodiment, the first semiconductor layer 140 and the second semiconductor layer 160 are semiconductor layers doped as an n type and a p type, respectively. The reverse case is also available.

The transparent electrode 130 formed on the first semiconductor layer 140 according to the embodiment of the present invention is constructed with a transparent material (resistance change material) which has high transmittance with respect to light in a UV wavelength range and of which resistance state is to be changed according to an applied electric field. The resistance change material is mainly used in the field of ReRAM (resistive RAM). If a threshold voltage or more inherent in the material is applied to the material, electrical break-down phenomenon occurs and electro-forming is performed, so that the resistance state of the resistance change material which is originally an insulating material is changed from a high resistance state into a low resistance state. Therefore, the material has conductivity.

More specifically, if a threshold voltage or more is applied to the resistance change material which is an insulating material, electrode metal materials are inserted into a thin film due to electric stress (forming process), or a defective structure occurs in the thin film, so that conducting filaments 132 (or, metallic filaments) are formed in the resistance change material as illustrated in FIG. 2. After that, although the voltage applied to the material is removed, the conducting filaments 132 remain, and current can flow through the conducting filaments 132, so that the low resistance state of the material is maintained.

Figure 3A:
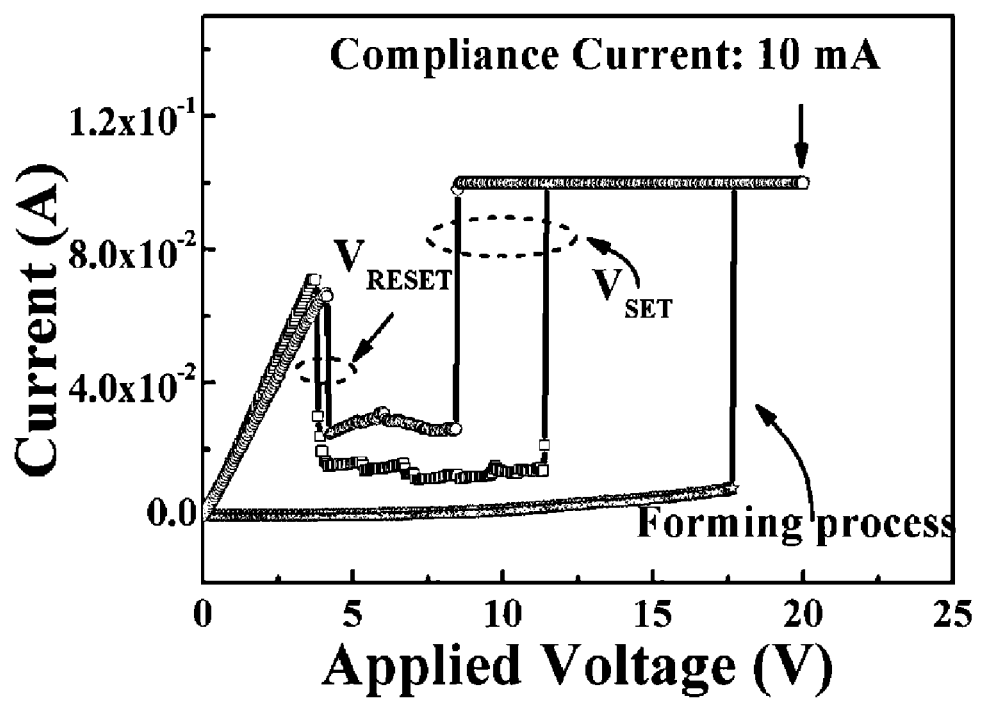
FIGS. 3A and 3B are diagrams illustrating characteristics of a resistance change material.

Referring to FIG. 3a, it can be seen that the resistance change material (for example, AlN) has an insulating characteristic before the forming process and has an I-V characteristic of a metal after the forming process.

Figure 3B:
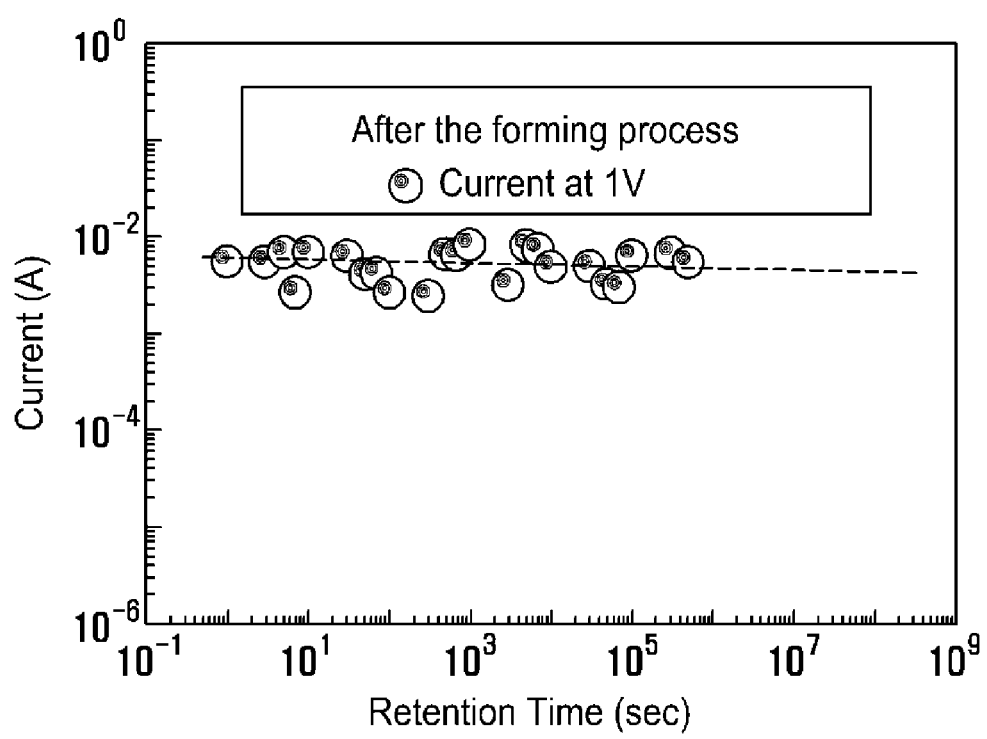

FIG. 3B is a graph illustrating how long the resistance state can be stably maintained after the conducting filaments 132 are formed. It can be seen from a dotted line in the graph that the low resistance state can be stably maintained for ten years after the conducting filaments 132 are formed.

In the embodiment of the present invention, a transparent conductive oxide based material ($SiO_2$, $Ga_2O_3$, $Al_2O_3$, ZnO, ITO, or the like), a transparent conductive nitride based material ($Si_3N_4$, AlN, GaN, InN, or the like), a transparent conductive polymer based material (polyaniline (PANI)), poly (ethylenedioxythiophene)-polystyrene sulfonate (PEDOT: PSS) or the like), and a transparent conductive nano material (CNT, CNT-oxide, Graphene, Graphene-oxide, or the like) or the like may be used as the resistance change material. In addition to the above-described materials, any material which is transparent and has the above-described resistance change characteristic can be used to form the transparent electrode 130 according to the present invention. It should be noted that the statement that the material has conductivity denotes that the material is allowed to have conductivity as a result of the forming process according to the electro break-down phenomenon, by which the conducting filaments 132 are formed in the transparent electrode. In addition, it should be noted that the forming process is performed on the transparent electrode 130 according to the present invention, so that the conducting filaments are formed in the transparent electrode.

In addition, generally, thermal treatment is performed in a semiconductor process. Due to the thermal treatment, electric characteristics of elements are deteriorated. In the present invention, it found that, in the case where the electro-forming is performed due to electrical break-down phenomenon in the transparent electrode, the electric characteristics of the elements which are deteriorated due to the thermal treatment can be recovered.

In addition, a convex-concave pattern is formed on the surface of the above-described transparent electrode 130, so that light efficiency can be further improved. In addition, the above-described transparent electrode 130 may be configured with a plurality of layers so that the refractive indexes of the layers are gradually increased in the direction toward the n-type electron pad 190. Therefore, total reflection can be reduced due to a difference in refractive index, so that light efficiency can be further improved.

On the other hand, as illustrated in FIG. 2, if the light emitting device is completed, the current injected through the n-type electrode pad 190 formed on the transparent electrode 130 spreads over the entire area through the conducting filaments 132, which are connected to each other in the transparent electrode 130, to be injected into the entire first semiconductor layer 140. The light in a UV wavelength range as well as the light in a visible wavelength range generated in the activation layer 150 is emitted out through the transparent electrode having a large band gap.

FIG. 4 is a diagram illustrating processes of manufacturing a vertical type light emitting device where the transparent electrode is formed according to the first embodiment of the present invention.

The processes of manufacturing the vertical type semiconductor light emitting device according to the first embodiment of the present invention will be described with reference to FIG. 4.

First, referring to (a) of FIG. 4, a buffer layer 120 is formed on a substrate 110 such as a sapphire substrate, and a transparent electrode 130 is formed on the buffer layer 120 by using a resistance change material. The buffer layer 120 may be formed by using GaN, AlN, or the like. In addition, the material used for the transparent electrode is described above. The method of fabricating the transparent electrode 130 is the same as the method of fabricating a transparent electrode of a general light emitting device.

In addition, the above-described transparent electrode 130 may be configured with a plurality of layers so that the refractive indexes of the layers are gradually increased in the upward direction (in the direction toward the first semiconductor layer 140). Therefore, in a light emitting device including the above transparent electrode, total reflection can be reduced due to a difference in refractive index, so that light efficiency can be further improved.

Next, an n-type first semiconductor layer 140 (for example, n-GaN, n-AlGaN, or the like) is formed on the transparent electrode 130. After an activation layer (MQW) 150 is formed on the first semiconductor layer 140, a p-type second semiconductor layer 160 (for example, p-GaN, p-AlGaN, or the like) is formed on the activation layer 150. Next, a reflective layer 170 is formed on the second semiconductor layer 160. The reflective layer 170 may be formed by using Al, Au, Ag, or other materials used for forming a reflective layer in the process of manufacturing a general LED.

Next, as illustrated in (b) of FIG. 4, a bonding layer (bonding metal) 180 for bonding the submount substrate 200 is formed on the reflective layer 170. Next, the bonding layer 180 formed on the reflective layer 170 is bonded to the submount substrate 200 so that the sapphire substrate 110 is disposed at the upper side. In order to separate the sapphire substrate 110 from the light emitting device, a UV laser beam having a wavelength range of 245 nm to 305 nm is irradiated through the sapphire substrate 110.

The irradiated laser beam passes through the sapphire substrate 110 and is absorbed at the interface between the sapphire substrate 110 and the buffer layer 120, so that the buffer layer 120 and the substrate 110 are separated from each other. In the case where the buffer layer 120 is formed by using GaN, the GaN of the buffer layer 120 absorbing the UV laser beam is decomposed into Ga and $N_2$. The generated $N_2$ is released to an external portion, so that only Ga remains on the interface. The Ga having a melting point of about 30° C. is melted by applied heat, so that the sapphire substrate 110 is separated.

Next, as illustrated in (c) of FIG. 4, after the substrate 110 is separated, the remaining buffer layer 120 is removed through an etching process so that the transparent electrode 130 is exposed. A photoresist layer (not shown) is formed on the exposed transparent electrode 130, and a pattern for forming the forming electrode 410 is formed on a portion of the area of the photoresist layer where an n-type metal pad 190 is to be formed by performing a photolithography process. Next, by performing an e-beam process, a sputtering process, or other metal deposition processes, the forming electrode 410 is formed in the pattern. Next, the forming electrode 410 is completed by removing the photoresist layer except for the forming electrode 410 through a lift-off process.

Next, as illustrated in (d) of FIG. 4, if a threshold voltage or more inherent in the material is applied to the forming electrode 410 formed on the transparent electrode 130, the forming process caused by the electrical break-down is performed, so that the conducting filaments 132 are formed in the transparent electrode 130 which is an insulating material. Accordingly, the resistance state of the transparent electrode 130 is changed from a high resistance state into a low resistance state.

In this case, before the forming process is performed, a convex-concave pattern may be additionally formed on the surface of the transparent electrode 130, so that the light efficiency can be further improved. The method of forming the convex-concave pattern on the transparent electrode 130 may employ a well-known method in the related art, and thus, the detailed description thereof is omitted.

After the conducting filaments 132 are formed in the transparent electrode 130, as illustrated in (e) of FIG. 4, an n-type metal electrode pad 190 is formed on the transparent electrode 130. At this time, as a method of forming the metal electrode pad 190, the forming electrode 410 for performing the forming process may be removed, and a separate metal electrode pad may be formed. Alternatively, metal is additionally deposited on the forming electrode 410 by using a mask (not shown), so that the n-type metal electrode pad 190 may be formed.

Hereinbefore, the light emitting device according to the first embodiment of the present invention and the method of manufacturing the light emitting device are described.

In the first embodiment described above with reference to FIGS. 2 to 4, some conducting filaments 132 formed in the transparent electrode 130 may not be connected to other conducting filaments 132. In this case, current flowing into the transparent electrode 130 may not spread over the entire transparent electrode 130 but be concentrated to be localized, so that a problem of current concentration that current is concentrated to be localized on the first semiconductor layer 140 which is in contact with the transparent electrode 130 may occur.

Figure 5B:
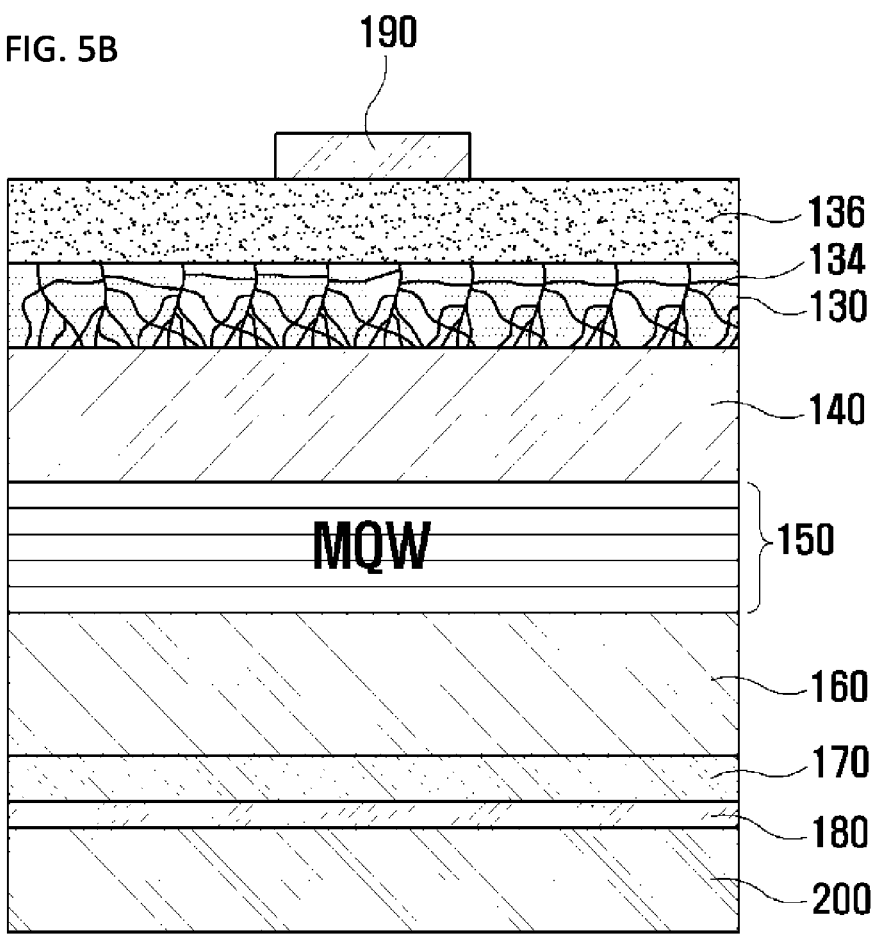

FIGS. 5A and 5B are diagrams illustrating configurations of light emitting devices according to the second embodiment of the present invention for solving the problem of current concentration.

In the examples illustrated in FIGS. 5A and 5B, in order to improve the current spreading characteristics of the transparent electrode 130, a current spreading layers 134 or 136 formed by using CNT (carbon nano tube) or graphene which connects the conducting filaments 132 formed in the transparent electrode 130 is formed on an upper or lower surface of the transparent electrode 130.

FIG. 5A illustrates an example where the current spreading layer 134 formed by using CNT or graphene is formed between the transparent electrode 130 and the second semiconductor layer 160. FIG. 5B illustrates an example where the current spreading layer 136 formed by using CNT or graphene is formed on the transparent electrode 130.

The CNT and graphene have good conductivity and transmittance characteristics. In the present invention, the conducting filaments 132 in the transparent electrode 130 are connected to each other by forming the current spreading layers 134 and 136 by using CNT or graphene on one surface of the transparent electrode 130 by using the characteristics, so that the current flowing into the transparent electrode 130 can be allowed to spread over the entire first semiconductor layer 140.

At this time, as the thickness of the current spreading layers 134 and 136 is increased, CNTs and graphenes are connected to each other, and thus, the possibility that the conducting filaments 132 are connected to each other is increased. As a result, the conductivity of the transparent electrode 130 is increased, but the transmittance thereof is decreased. Therefore, it is preferable that the current spreading layers 134 and 136 according to the present invention are formed with a thickness enough to connect the conducting filaments 132 in the transparent electrode 130 to each other and as thin as possible within a range where the transmittance is not deteriorated.

In the second embodiment of the present invent illustrated in FIGS. 5A and 5B, the current spreading layers 134 and 136 are formed with a thickness of about 2 nm to about 100 nm. The thickness of 2 nm is a minimum thickness so that a single layer of CNT or graphene can be formed, and the thickness of 100 nm is a maximum thickness so that transmittance can be maintained to be 80% or more.

The manufacturing processes of the example illustrated in FIG. 5A are the same as those of the example described with reference to FIG. 4, except that the current spreading layer 134 is formed by using CNT or graphene just after the transparent electrode is formed and the first semiconductor layer 140 is formed on the current spreading layer 134, and thus, the detailed description thereof is omitted.

The manufacturing processes of the example illustrated in FIG. 5B are the same as those of the example described with reference to FIG. 4, except that the current spreading layer 136 is formed by using CNT or graphene just after the conducting filaments 132 are formed in the transparent electrode 130 by performing the forming process and the n-type electrode pad 190 is formed on the current spreading layer 136, and thus, the detailed description thereof is omitted.

Figure 6:
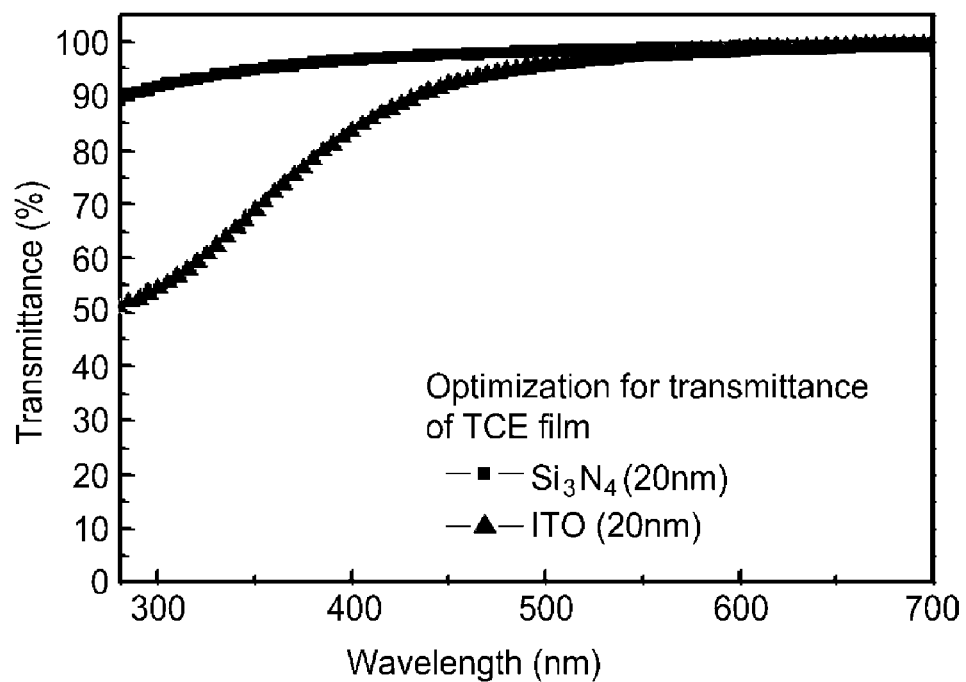
FIG. 6 is a graph illustrating transmittance-wavelength curves of an ITO transparent electrode and a transparent electrode ($Si_3N_4$) according to the embodiment of the present invention.

FIG. 6 is a graph illustrating transmittance of an ITO transparent electrode in the related art and transmittance of the transparent electrode ($Si_3N_4$) according to the embodiment of the present invention in wavelength ranges.

The ITO transparent electrode and the transparent electrode ($Si_3N_4$) are formed with the same thickness of 20 nm. Referring to FIG. 6, it can be understood from the result of comparison of the transmittance of the ITO transparent electrode in the related art and the transmittance of the transparent electrode ($Si_3N_4$) in which the conducting filaments are formed according to the embodiment of the present invention in wavelength ranges that the transparent electrode ($Si_3N_4$) according to the present invention has high transmittance in the entire wavelength ranges. Particularly, it can be understood that the transparent electrode ($Si_3N_4$) according to the present invention has very high transmittance in the short wavelength range in comparison to the ITO transparent electrode in the related art.

Figure 7A:
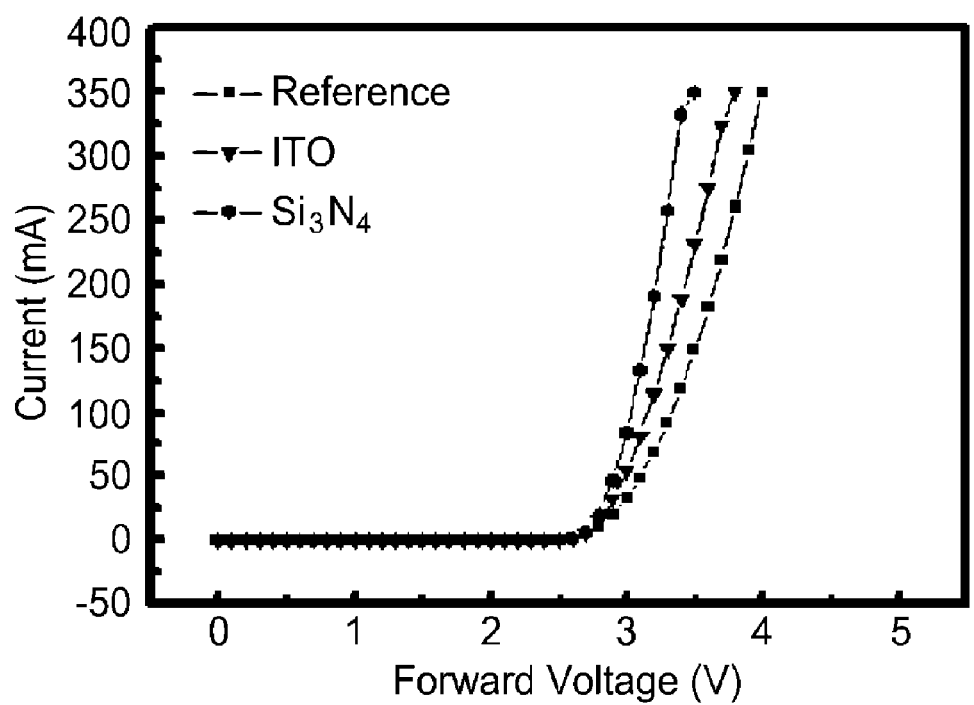
FIG. 7A is a graph illustrating operating voltage characteristics of the light emitting device according to the embodiment of the present invention.
Figure 7B:
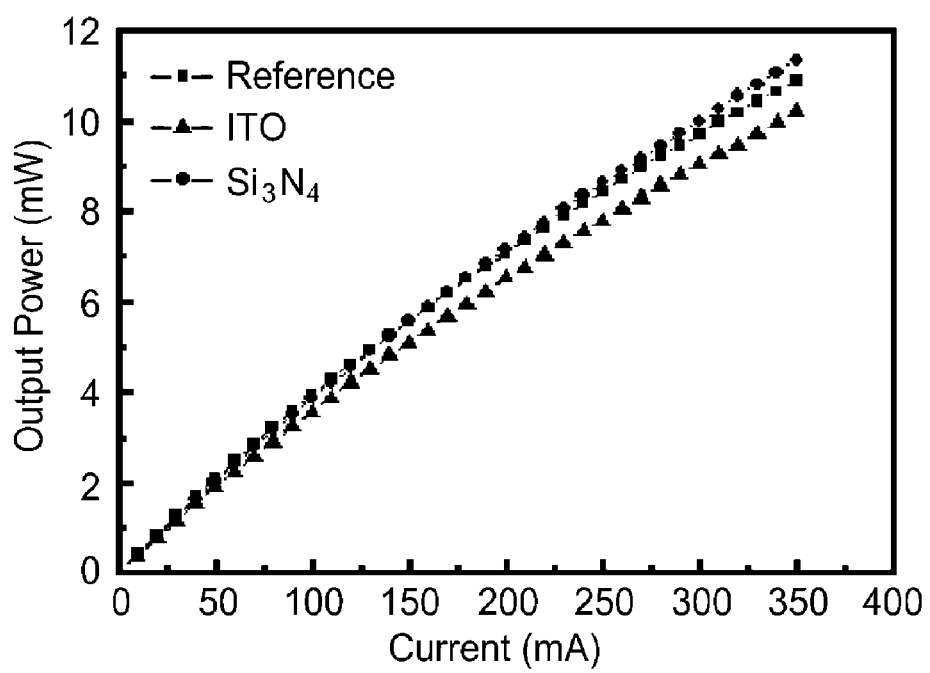
FIG. 7B is a graph illustrating output characteristics of the light emitting device according to the embodiment of the present invention.

FIG. 7A is a graph illustrating operating voltage characteristics of the light emitting device according to the embodiment of the present invention, and FIG. 7B is a graph illustrating output characteristics of the light emitting device according to the embodiment of the present invention.

Referring to FIGS. 7A and 7B, a general vertical type light emitting device in the related art in which no transparent electrode is inserted is selected as a reference light emitting device, and characteristics of a vertical type light emitting device where an ITO transparent electrode having a thickness of 20 nm is formed as a current dispersion layer and characteristics of a vertical type light emitting device where the transparent electrode ($Si_3N_4$) having a thickness of 20 nm according to the embodiment of the present invention is formed as a current dispersion layer are compared.

In terms of the operating voltage $V_F$, it can be understood that the performance of the light emitting devices where the current dispersion layer is improved in comparison to the reference light emitting device. In addition, it can be understood that the performance of the light emitting device where the transparent electrode ($Si_3N_4$) is formed according to the embodiment of the present invention is further improved in comparison to the light emitting device where the ITO transparent electrode is formed.

In terms of the output power $P_O$, it can be understood that the performance of the light emitting devices according to the embodiment of the present invention is improved in comparison to the reference light emitting device. However, it can be understood that the performance of the light emitting device where the ITO transparent electrode is formed is deteriorated in comparison to the reference light emitting device.

Accordingly, it can be understood that a vertical type light emitting device where the transparent electrode according to the present invention ($Si_3N_4$) in which the conducting filaments are formed due to the electrical break-down phenomenon is formed has excellent performances in terms of current dispersion effect, transmittance, and other electric characteristics.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A method of manufacturing a vertical type light emitting device, comprising:
    (a) forming a transparent electrode on a substrate by using a transparent insulating material of which resistance state is to be changed from a high resistance state into a low resistance state according to an applied electric field;
    (b) sequentially forming a first semiconductor layer, an activation layer which generates light, a second semiconductor layer, and a reflective layer on the transparent electrode;
    (c) bonding a submount substrate so as to be in contact with the reflective layer and separating the substrate; and
    (d) changing the resistance state of the transparent electrode into a low resistance state by applying a voltage to the transparent electrode.

2. The method according to claim 1, wherein the (d) changing of the resistance state is performing a forming process by applying a threshold voltage or more to the transparent electrode, so that conducting filaments are formed in the transparent electrode.

3. The method according to claim 1, wherein the (c) bonding of the submount substrate further includes:
    (c1) forming a bonding layer on the reflective layer and bonding a submount substrate to the bonding layer; and
    (c2) separating the substrate from the transparent electrode.

4. The method according to claim 1, wherein the (d) changing of the resistance state is forming a convex-concave pattern on a surface of the transparent electrode and changing a resistance state of the transparent electrode into a low resistance state.

5. The method according to claim 1, wherein, in the (a) forming of the transparent electrode, the transparent electrode is configured by sequentially forming a plurality of transparent electrode layers of which refractive indexes are gradually increased.

6. The method according to claim 1, wherein the transparent electrode is formed by using any one of a transparent oxide based material, a transparent nitride based material, a transparent polymer based material, and a transparent nano material.

7. The method according to claim 1, further comprising, between the (a) forming of the transparent electrode and the (b) sequentially forming of the first semiconductor layer, the activation layer which generates light, the second semiconductor layer, and the reflective layer, forming a current spreading layer on the transparent electrode by using CNT or graphene,
    wherein, in the (b) sequentially forming of the first semiconductor layer, the activation layer which generates light, the second semiconductor layer, and the reflective layer, the first semiconductor layer is formed on the current spreading layer.

8. The method according to claim 1, further comprising forming a current spreading layer on the transparent electrode of which resistance state is changed into a low resistance state by using CNT or graphene.

9. The method according to claim 1, wherein the first semiconductor layer is formed with an n-AlGaN layer or an n-GaN layer, and the second semiconductor layer is formed with a p-AlGaN layer or a p-GaN layer.

* * * * *